United States Patent
Yun et al.

(10) Patent No.: US 7,723,148 B2
(45) Date of Patent: May 25, 2010

(54) METHOD FOR MANUFACTURING IMAGE SENSOR

(75) Inventors: Ki Jun Yun, Suwon-si (KR); Sang Il Hwang, Wonju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 209 days.

(21) Appl. No.: 11/999,239

(22) Filed: Dec. 3, 2007

(65) Prior Publication Data
US 2008/0160664 A1    Jul. 3, 2008

(30) Foreign Application Priority Data
Dec. 29, 2006   (KR)   ............. 10-2006-0138982

(51) Int. Cl.
*H01L 31/18* (2006.01)
(52) U.S. Cl. ............ 438/70; 438/689; 438/690; 438/694; 438/697; 438/698; 257/E31.127; 257/432
(58) Field of Classification Search ............... None
See application file for complete search history.

(56) References Cited

U.S. PATENT DOCUMENTS

| | | | |
|---|---|---|---|
| 5,990,992 A | 11/1999 | Hamanaka et al. | |
| 6,043,481 A * | 3/2000 | Tan et al. | 250/216 |
| 6,221,687 B1 * | 4/2001 | Abramovich | 438/70 |
| 6,586,811 B2 | 7/2003 | Sekine | |
| 6,781,762 B2 | 8/2004 | Ozawa | |
| 7,064,901 B2 | 6/2006 | Ozawa | |
| 7,166,484 B2 | 1/2007 | Lee | |

(Continued)

FOREIGN PATENT DOCUMENTS

CN    1819220 A    8/2006

(Continued)

OTHER PUBLICATIONS

Won Ho Lee and Suk Hee Jang; Method of Manufacturing Image Sensor with Bridge-Free Microlens; Korean Patent Abstracts; Publication No. 1020050060649 A; Publication Date: Jun. 22, 2005; Korean Intellectual Property Office, Republic of Korea.

(Continued)

*Primary Examiner*—Thanh V Pham
*Assistant Examiner*—Andres Munoz
(74) *Attorney, Agent, or Firm*—The Law Offices of Andrew D. Fortney; Andrew D. Fortney; William K. Nelson

(57) ABSTRACT

Provided is a method for manufacturing an image sensor. The method includes the following. A color filter layer is formed on a semiconductor substrate having a photodiode and a transistor formed thereon. A planarization layer is formed on the color filter layer. An LTO (Low Temperature Oxide) layer is formed on the planarization layer. A photoresist pattern is formed to correspond to the color filter layer on the LTO layer, and a reflow process is performed. A microlens array is formed by reactive ion etching the photoresist pattern and the LTO layer. A second reflow process may be performed on the photoresist pattern and/or the LTO layer during the reactive ion etching process.

20 Claims, 3 Drawing Sheets

U.S. PATENT DOCUMENTS

| | | | |
|---|---|---|---|
| 7,341,885 | B2 | 3/2008 | Kim |
| 7,355,222 | B2 | 4/2008 | Wells |
| 2001/0051405 | A1 | 12/2001 | Sekine |
| 2004/0027680 | A1 | 2/2004 | Ozawa |
| 2004/0246587 | A1 | 12/2004 | Ozawa |
| 2005/0130071 | A1* | 6/2005 | Lee ............................ 430/320 |
| 2005/0173773 | A1 | 8/2005 | Kim |
| 2005/0202586 | A1 | 9/2005 | Yamanaka et al. |
| 2006/0023313 | A1 | 2/2006 | Kim |
| 2006/0027887 | A1 | 2/2006 | Boettiger et al. |
| 2006/0138500 | A1 | 6/2006 | Kim |
| 2006/0145218 | A1* | 7/2006 | Hwang ....................... 257/294 |
| 2006/0261342 | A1 | 11/2006 | Wells |
| 2008/0143859 | A1 | 6/2008 | Wells |
| 2008/0156970 | A1 | 7/2008 | Han et al. |
| 2008/0157243 | A1* | 7/2008 | Cho ............................ 257/432 |
| 2008/0224193 | A1 | 9/2008 | Kim |

FOREIGN PATENT DOCUMENTS

| | | |
|---|---|---|
| JP | 3-280574 | 12/1991 |
| JP | 2001-332711 A | 11/2001 |
| KR | 2003-0057623 | 7/2003 |
| KR | 10-2004-0058749 | 7/2004 |
| KR | 10-2005-0057968 A | 6/2005 |
| KR | 10-2005-0060649 A | 6/2005 |

OTHER PUBLICATIONS

Ju Ii Lee; Method of Manufacturing Image Sensor with Inorganic Microlens for Preventing Crack and Contamination; Korean Patent Abstracts; Publication No. 1020050057968 A; Publication Date: Jun. 16, 2005; Korean Intellectual Property Office, Republic of Korea.

Won Ho Lee; CMOS Image Sensor with Different Radius of Curvature of Microlens Corresponding to Wavelength of Incident Light and Manufacturing Method Thereof; Korean Patent Abstract; Publication No. 1020040058749 A; Publication Date: Jul. 5, 2004; Korean Intellectual Property Office.

Won Ho Lee; CMOS Image Sensor and Method for Manufacturing the Same; Korean Patent Abstract; Publication No. 1020030057623 A; Publication Date: Jul. 7, 2003; Korean Intellectual Property Office.

Shunichi Naka and Junichi Nakai; Solid-State Image Sensing Device; esp@cenet database; Publication No. JP3280574; Publication Date: Dec. 11, 1991.

Chang Hun Han and Joon Hwang; "Image Sensor and Fabricating Method Thereof"; U.S. Appl. No. 12/001,638, filed Dec. 11, 2007.

Chang Hun Han and Hea Soo Chung; "Image Sensor and Fabricating Method Thereof"; U.S. Appl. No. 12/001,652, filed Dec. 11, 2007.

Ki Jun Yun and Sang Il Hwang; "Method for Fabricating Image Sensor"; U.S. Appl. No. 12/001,629, filed Dec. 11, 2007.

Seoung H. Kim; "CMOS Image Sensor and Method for Fabricating the Same"; esp@cenet; Chinese Publication No. CN1819220 (A); Publication Date: Aug. 16, 2006; Abstract of corresponding document: US 2006138500 (A1); esp@cenet Database—Worldwide.

Eishin Tsugawa; "Solid-State Image Pickup Element and Its Manufacturing Method"; esp@cenet; Abstract of Publication No. JP2001332711 (A); Publication Date: Nov. 30, 2001; esp@cenet Database—Worldwide.

\* cited by examiner

METHOD FOR MANUFACTURING IMAGE SENSOR

BACKGROUND

Embodiments of the invention relate to a method for manufacturing an image sensor.

Image sensors are semiconductor devices that convert optical images to electrical signals, and of these, charge coupled devices (CCDs) have individual metal oxide silicon (MOS) capacitors that are tightly packed together, in which charge carriers are stored and transferred.

Complementary MOS (CMOS) image sensors are devices that use a switching method and that employ CMOS technology using control circuits and signal processing circuits as peripheral circuits and that detect outputs in sequence using a number of MOS transistors related to the number of pixels.

One obstacle that needs to be overcome in the manufacturing of image sensors is the conversion rate of incident light signals to electrical signals. In other words, sensitivity needs to be increased.

A microlens is formed on the uppermost layer of a CMOS image sensor. Light focused by the microlens is transmitted through a planarization layer and a color filter array layer, and is converted to electrical signals in a light collector such as a photodiode.

An image sensor uses signals that have been converted to electrical signals through the above process to display images. Here, the image is affected by factors such as the focal length of the microlens, the size and distribution of the color filter, the thickness of the planarization layer, and the pitch size of the photodiode.

Also, for forming microlenses that focus light, there have been many methods proposed for minimizing the gaps between neighboring microlenses or producing a zero gap therebetween.

SUMMARY

Embodiments of the invention provide a method of manufacturing an image sensor with minimized gaps between the lenses of a microlens array.

In one embodiment, a method for forming an image sensor includes forming a color filter layer on a semiconductor substrate having a photodiode and a transistor thereon; forming a planarization layer on the color filter layer; forming an LTO (Low Temperature Oxide) layer on the planarization layer; forming a photoresist pattern (e.g., corresponding to color filters in the color filter layer) on the LTO layer, and performing a reflow process; forming a microlens array by performing a reactive ion etching process on the photoresist pattern and the LTO layer; and optionally, performing a second reflow process on the photoresist pattern and/or the LTO layer during the reactive ion etching process.

The details of one or more embodiments are set forth in the accompanying drawings and the description below. Other features will be apparent from the description and drawings, and from the claims.

DETAILED DESCRIPTION OF THE EMBODIMENTS

Figure 1:
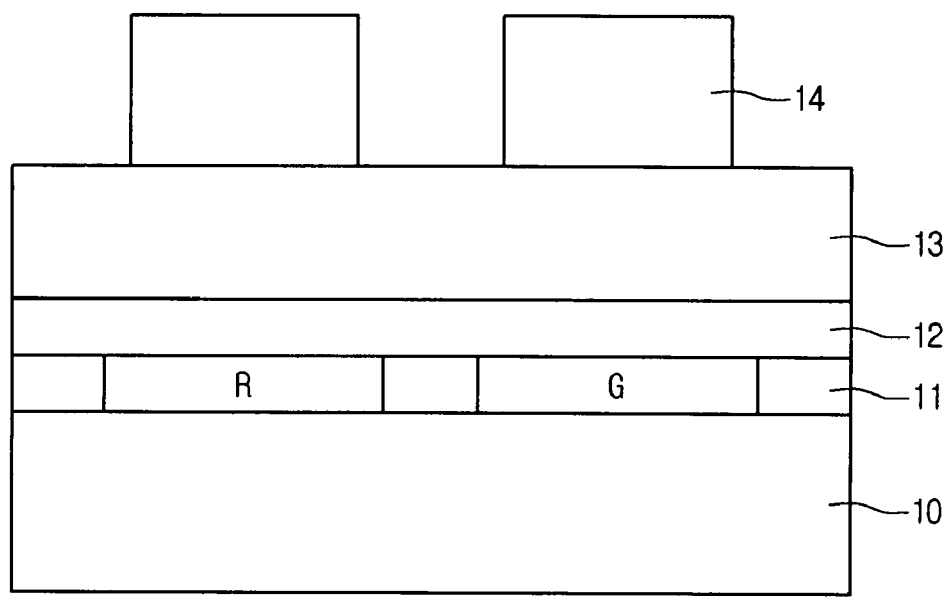
FIGS. 1 to 4 are sectional views for describing a manufacturing method of an image sensor according to the present embodiments.

Reference will now be made in detail to the embodiments of the present disclosure, examples of which are illustrated in the accompanying drawings.

FIGS. 1 to 4 are sectional views for describing a manufacturing method of an image sensor according to various embodiments.

Referring to FIGS. 1 to 4, first a color filter layer 11 is formed on a semiconductor substrate, a planarization layer 12 is formed on top of the color filter layer 11, and a low temperature oxide (LTO) layer 13 is formed on top of the planarization layer 12. Then, a photoresist is applied on top of the LTO layer 13 and patterned to form a photoresist pattern 14. While not shown, a photodiode and a transistor may be formed on the semiconductor substrate 10, and at least one interlayer insulating layer and a metal line may also be included. The semiconductor substrate 10 generally comprises a plurality of unit pixels, each of which contains a photodiode and a determined number of transistors (typically 3, 4 or 5).

The color filter layer 11 may include red (R) color filters, green (G) color filters, and blue (B) color filters, typically in an array corresponding to the unit pixels. Filters of other colors (e.g., yellow, cyan and magenta) may be included or various arrangements can be used, depending on the color filter design. In one embodiment, the red color filter, the green color filter, and the blue color filter each are arranged in a position corresponding to an underlying photodiode in a unit pixel of the image sensor.

The LTO layer 13 may comprise silicon dioxide, and the LTO layer 13 may be formed by plasma enhanced chemical vapor deposition (PECVD) from silicon dioxide precursors (e.g., a silicon source such as silane gas or tetraethyl orthosilicate, and an oxygen source such as dioxygen and/or ozone) at a temperature of 250° C. or less. In various embodiments, the LTO layer 13 may be formed by PECVD at a temperature range of 150-200° C. with a thickness of 200-500 nm (e.g., 370 nm).

The photoresist pattern 14 is for forming microlens precursors, which are used to make microlenses from the LTO layer 13. The photoresist pattern 14 is formed by coating an appropriate photoresist material on the LTO layer 13 to a thickness of 250-500 nm (e.g., 400 nm) and then patterning the photoresist.

Figure 2:
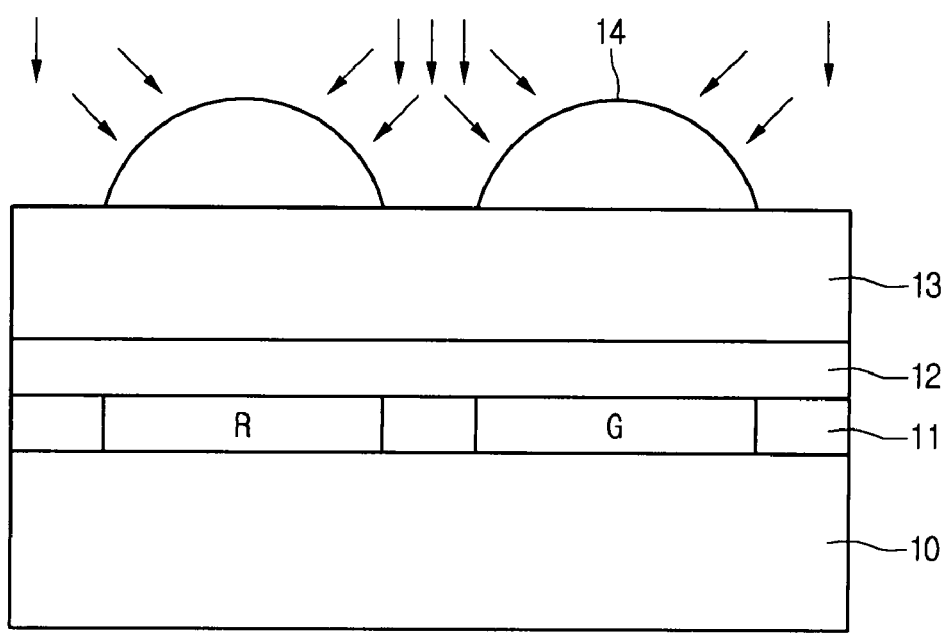

As shown in FIG. 2, the photoresist pattern 14 is subjected to a heat treatment such as a reflow process to form microlens shapes (e.g., microlens precursors. This reflow process may be conducted at a temperature of from 120 to 250° C. (e.g., 150-200° C.). Then, the photoresist pattern 14 is used as a mask to etch the LTO layer 13 using an anisotropic reactive ion etch (RIE) method.

Figure 3:
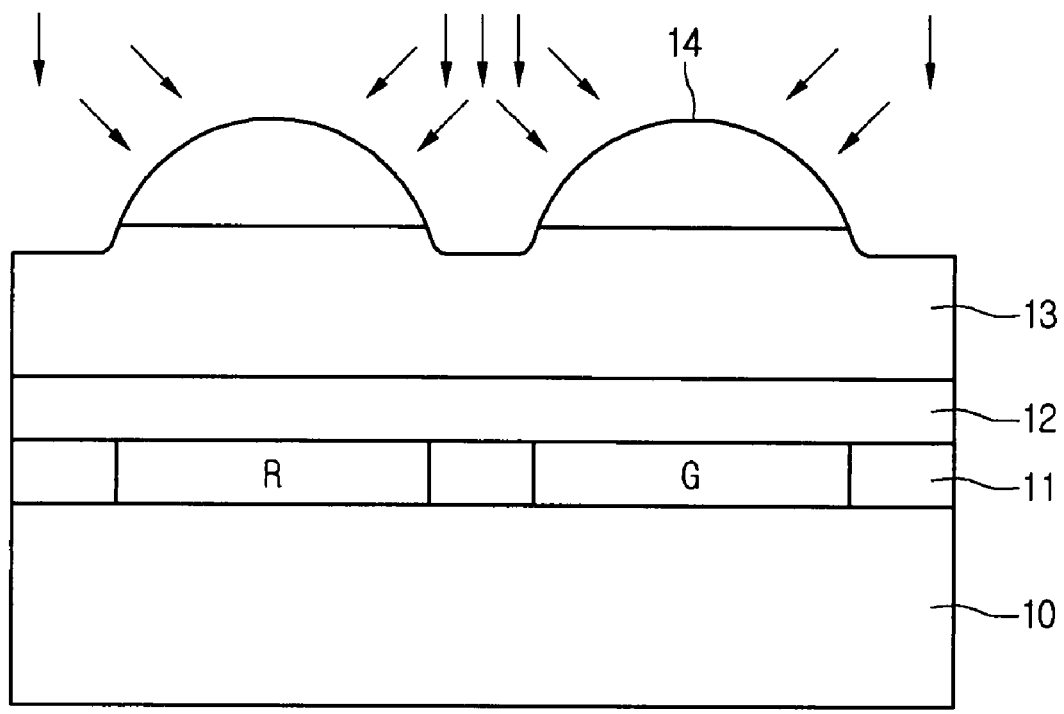
Figure 4:
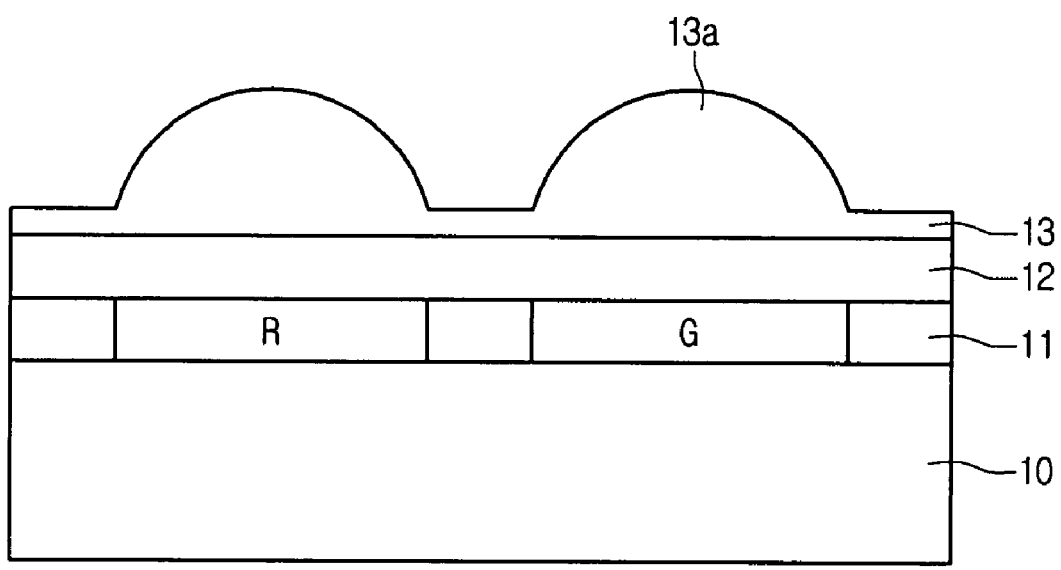
Figure 6:
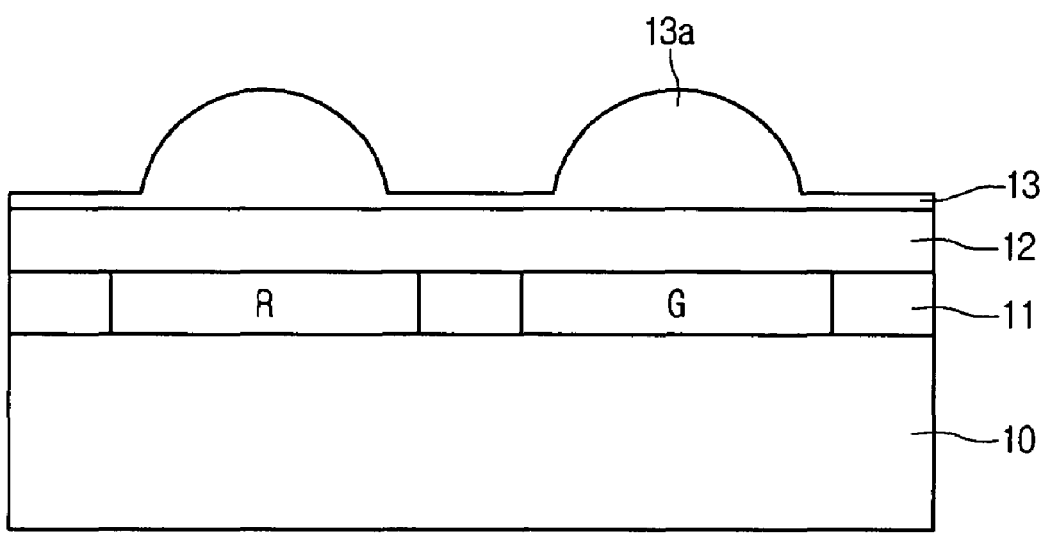

Here, as shown in FIG. 3, the photoresist pattern 14 is removed and the LTO layer 13 is simultaneously etched to form the microlenses shown in FIGS. 4 and 6.

The occurrence of a sidewall effect during the performing of the RIE process on the LTO layer 13 may etch the sides of the photoresist pattern 14, thereby reducing the surface area of the photoresist pattern 14. Accordingly, the gaps between the microlens precursors formed from the photoresist pattern 14 may be widened.

Referring to FIG. 3, in the present embodiments, a further reflow process is performed on the photoresist pattern 14 in a RIE process to supplement the sides (e.g., reduce isotropic etching) of the photoresist pattern 14. The RIE process is performed with a bias power-to-source power ratio in a range of between 1:1 and 5:1 and in a fluorine-based gas atmosphere. For example, the fluorine-based gas (etchant) may comprise a (hydro)fluorocarbon of the formula $C_xH_yF_z$, where x is an integer of from 1 to 5, y is 0 or an integer of from 1 to x, and (y+z)=2x or 2x+2. Suitable etchant gases include $CF_4$, $CHF_3$, $C_2F_6$, and cyclo-$C_4F_8$.

Also, in order to perform a reflow process on the photoresist pattern 14 in the RIE process, the source power may be increased by at least 1.1 times (e.g., 1.5 times) to raise the plasma temperature. For example, the bias power may be from 1000 to 3000 W, and the source power may be 0 W or from 10-3000 W. In one embodiment, the bias power may be set at 1200-1400 W, and the source power may be set at 200-400 W.

By performing a further reflow on the photoresist pattern 14 two to four times during the RIE process, a reduction in the surface area of the photoresist pattern 14 due to its sides being etched can be reduced or prevented. Thus, the gaps between the microlenses 13a formed through the photoresist pattern 14 may be minimized, as shown in FIG. 4.

Figure 5:
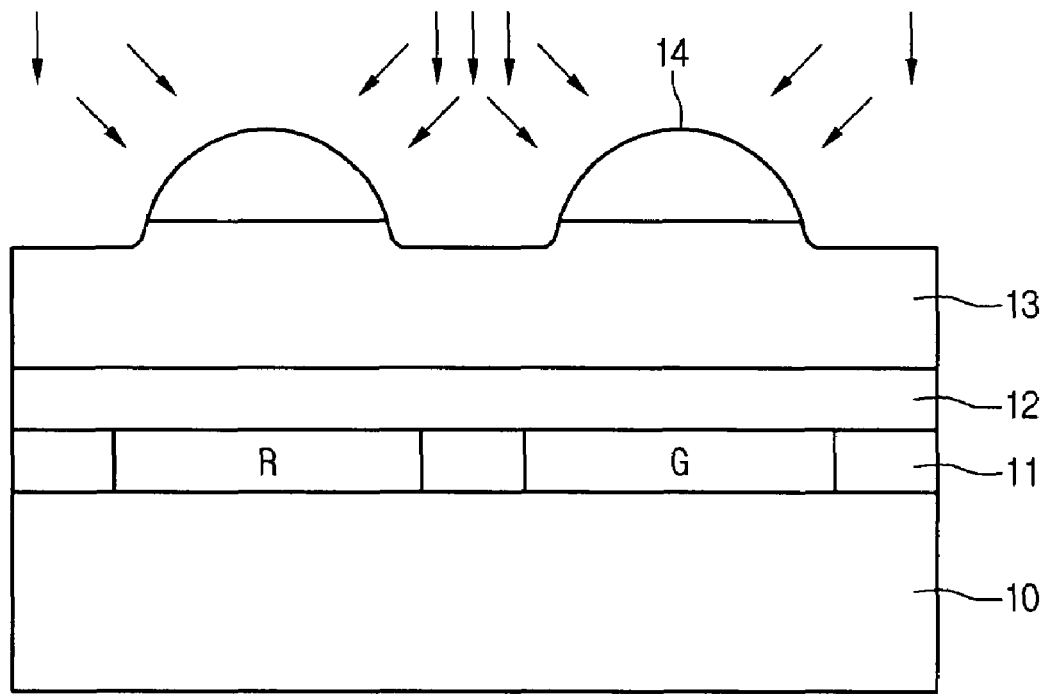
FIGS. 5 and 6 are sectional views for describing when a reflow process is not performed on a photoresist pattern during a reactive ion etch according to the present embodiments.

When comparing FIGS. 3 and 5, in FIG. 3, because a reflow process is performed on the photoresist pattern (microlens precursors) 14 when it is etched, the surface area thereof that contacts the LTO layer 13 is not significantly reduced by the RIE process. On the other hand, in FIG. 5, the photoresist pattern 14 is only etched, and does not have a reflow process performed thereon, and the surface area contacting the LTO layer 13 may be reduced as the RIE process progresses. However, in cases where the directionality of the anisotropic etch can be maximized and/or the selectivity of etching the microlens precursors 14 and the LTO layer 13 can be minimized, such a gap between microlenses may not be significant. Thus, the gap between one microlens 13a and an adjacent microlens 13a is not increased, minimizing the gaps between the microlenses 13a.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, the method comprising:
   forming a color filter layer on a semiconductor substrate having a photodiode and a transistor thereon;
   forming a planarization layer on the color filter layer;
   forming a low temperature oxide (LTO) layer on the planarization layer;
   forming a photoresist pattern on the LTO layer, and performing a reflow process;
   forming a microlens array by performing a reactive ion etching process on the photoresist pattern and the LTO layer; and
   performing a second reflow process on the photoresist pattern and/or the LTO layer during the reactive ion etching process.

2. The method according to claim 1, wherein forming the LTO layer comprises plasma enhanced chemical vapor deposition at a temperature of 150-200° C.

3. The method according to claim 2, wherein the plasma enhanced chemical vapor deposition comprises using a silicon source gas comprising silane or tetraethyl orthosilicate.

4. The method according to claim 2, wherein the plasma enhanced chemical vapor deposition comprises using an oxygen source gas comprising ozone and/or dioxygen.

5. The method according to claim 1, wherein the reactive ion etching process is an anisotropic etching process.

6. The method according to claim 1, wherein the reactive ion etching process is performed under conditions comprising a source power-to-bias power ratio in a range of between 1:1 and 1:5 and a fluorine-based gas atmosphere.

7. The method according to claim 1 wherein performing the second reflow process on the photoresist pattern and/or the LTO layer during the reactive ion etching process comprises increasing the source power by at least 1.1 times to raise a plasma temperature.

8. The method according to claim 7, wherein the source power is increased by 1.5 times.

9. The method according to claim 1 wherein performing the second reflow process on the photoresist pattern and/or the LTO layer during the reactive ion etching process further comprises setting the bias power in a range of 1000-3000 W and the source power in a range of 10-3000 W.

10. The method according to claim 1 wherein performing the second reflow process on the photoresist pattern and/or the LTO layer during the reactive ion etching process further comprises setting the bias power in a range of 1200-1400 W and the source power in a range of 200-400 W.

11. The method according to claim 1, wherein a plurality of photodiodes and a plurality of transistors are on the semiconductor substrate.

12. The method according to claim 1, wherein the color filter layer comprises a plurality of color filters, and the photoresist pattern corresponds to the color filters.

13. The method according to claim 1, wherein the photoresist pattern includes a plurality of microlens precursors, each of which corresponds to a separate color filter.

14. The method according to claim 1, wherein a plurality of photodiodes are on the semiconductor substrate, each of which receives light from a separate microlens.

15. The method according to claim 1, wherein performing the reflow process forms a microlens precursor pattern on an upper surface of the photoresist pattern.

16. The method according to claim 15, wherein the reactive ion etching process comprises substantially translating the microlens precursor pattern to the LTO layer to form the microlens array.

17. The method according to claim 15, wherein the second reflow process is performed two to four times during the reactive ion etching process.

18. The method according to claim 1, wherein the LTO layer has a thickness of 200 to 500 nm.

19. The method according to claim 1, wherein forming the photoresist pattern comprises depositing a photoresist material to a thickness of 250 to 500 nm and patterning the photoresist material.

20. The method according to claim 1, wherein performing the reflow process comprises exposing the photoresist pattern to a temperature of 120 to 250 C.

* * * * *